United States Patent [19]
Irie

[11] Patent Number: 6,049,259
[45] Date of Patent: Apr. 11, 2000

[54] ELECTRONIC COMPONENT AND LADDER FILTER WITH ELECTRICALLY CONDUCTIVE AND INSULATING BONDING MEMBERS

[75] Inventor: Makoto Irie, Toyama, Japan

[73] Assignee: Murata Manufacturing Co., Ltd., Japan

[21] Appl. No.: 09/159,844

[22] Filed: Sep. 24, 1998

[30] Foreign Application Priority Data

Oct. 3, 1997 [JP] Japan ..................................... 9-287670

[51] Int. Cl.[7] .............................. H03H 9/05; H03H 9/15; H03H 9/54
[52] U.S. Cl. ........................... 333/187; 333/189; 310/348
[58] Field of Search ................... 333/186–190; 310/348

[56] References Cited

U.S. PATENT DOCUMENTS

| | | | |
|---|---|---|---|
| 4,450,377 | 5/1984 | Briese | 310/319 X |
| 4,503,352 | 3/1985 | Inoue | 333/187 X |
| 4,532,451 | 7/1985 | Inoue | 310/348 X |
| 5,825,262 | 10/1998 | Inoue et al. | 333/189 |
| 5,859,488 | 1/1999 | Okeshi et al. | 310/348 X |
| 5,892,416 | 4/1999 | Unami et al. | 333/187 |
| 5,900,790 | 5/1999 | Unami et al. | 333/187 |
| 5,912,600 | 6/1999 | Unami | 333/187 |
| 5,912,601 | 6/1999 | Unami et al. | 333/187 |

*Primary Examiner*—Robert Pascal
*Assistant Examiner*—Barbara Summons
*Attorney, Agent, or Firm*—Graham & James LLP

[57] ABSTRACT

An electronic component which functions as a discriminator includes a piezoelectric resonator having a substrate. First and second pattern electrodes are provided on a first major surface of the substrate. First and second support members made from an electrically conductive material are provided on external electrodes provided on one side surface of a piezoelectric resonator. One end of the first support member is electrically connected to a land of the first pattern electrode via electrically conductive paste and the other end of the first support member is mechanically connected to an insulating member disposed on the substrate. One end of the second support member is electrically connected to a land of the second pattern electrode via electrically conductive paste and the other end of the second support member is mechanically connected to another insulating member disposed on the substrate.

15 Claims, 19 Drawing Sheets

ELECTRONIC COMPONENT AND LADDER FILTER WITH ELECTRICALLY CONDUCTIVE AND INSULATING BONDING MEMBERS

BACKGROUND OF THE INVENTION

1. Technical Field of the Invention

The present invention relates to electronic components and ladder filters, and more particularly, to an electronic component, such as a ladder filter, including a piezoelectric resonator which uses a mechanical resonance of a piezoelectric member.

2. Description of the Related Art

FIG. 15 is a perspective view of a conventional piezoelectric resonator which provides a background of the present invention described below. A piezoelectric resonator 1 includes a piezoelectric substrate 2 having, for example, a rectangular plate shape. The piezoelectric substrate 2 is polarized in the thickness direction. On both major surfaces of the piezoelectric substrate 2, external electrodes 3 are provided. When a signal is input between the external electrodes 3, an electric field is applied to the piezoelectric substrate 2 in the thickness direction and the piezoelectric substrate 2 vibrates in the longitudinal direction.

The piezoelectric resonator shown in FIG. 15 is an unstiffened type, in which the vibration direction differs from the direction of polarization and the electrical field. The electromechanical coupling coefficient of such an unstiffened piezoelectric resonator is lower than that of a stiffened piezoelectric resonator, in which the vibration direction, the direction of polarization, and the direction in which an electric field is applied are the same. An unstiffened piezoelectric resonator has a relatively small frequency difference ΔF between the resonant frequency and the antiresonant frequency. This causes a frequency bandwidth to be narrow when an unstiffened piezoelectric resonator is used as a filter. Therefore, the degree of freedom in characteristics design is low in electronic components using such a piezoelectric resonator, including a filter and an oscillator.

The piezoelectric resonator shown in FIG. 15 uses the first-order resonance in the longitudinal mode. Also, as a result of the structure of the piezoelectric resonator shown in FIG. 15, this resonator generates large spurious resonances in odd-number harmonic modes, such as the third-order and fifth-order modes, and in the width mode. To suppress these spurious resonances, some corrective measures have been considered, such as polishing, increasing mass, and changing the shape of the electrodes. These measures increase manufacturing cost.

In addition, since the piezoelectric substrate has a rectangular plate shape, the substrate cannot be made thinner because of minimum strength requirements. Therefore, the distance between the electrodes cannot be reduced and a capacitance between terminals cannot be made large. This is extremely inconvenient for achieving impedance matching with an external circuit. To constitute a ladder filter by connecting a plurality of piezoelectric resonators in series and in parallel alternately, the capacitance ratio of the series resonator to the parallel resonator needs to be made large in order to increase attenuation. Because a piezoelectric resonator has the shape restriction described above, however, a large attenuation cannot be obtained.

In Japanese Unexamined Patent Publication No. 8-110475, which has been filed by the same applicant as in the present application, a piezoelectric resonator having a lamination structure which generates a longitudinal vibration in a basic mode has been proposed, in which a plurality of piezoelectric layers and a plurality of electrodes are laminated to form a base member having a longitudinal direction, and the plurality of piezoelectric layers are polarized in the longitudinal direction of the base member. A piezoelectric resonator having such a lamination structure is a stiffened type and has the piezoelectric layers arranged such that the vibration direction, the direction of polarization, and the direction in which an electrical field is applied are the same. The piezoelectric resonator has a smaller spurious resonance and a larger difference ΔF between the resonant frequency and the antiresonant frequency than an unstiffened piezoelectric resonator.

To produce a ladder filter with the use of a piezoelectric resonator having such a lamination structure, a structure shown in FIGS. 16 to 20, for example, can be considered.

FIG. 16 is an exploded perspective view of a ladder filter which provides a background of the present invention. FIG. 17 is a plan view of the ladder filter, and FIG. 18 is an elevation view of the ladder filter. FIG. 19 is a side view of the ladder filter, and FIG. 20 is a circuit diagram of the ladder filter. In the ladder filter 4 shown in FIGS. 16 to 20, four pattern electrodes 6a, 6b, 6c, and 6d are provided on an insulating substrate 5. Piezoelectric resonators 1a, 1b, 1c and 1d having the lamination structure described above are electrically connected to these pattern electrodes 6a to 6d. Two external electrodes 3a and 3b are provided with a gap in the width direction of each of the piezoelectric resonators 1a, 1b, 1c, and 1d on one side surface of each of the piezoelectric resonators 1a to 1d. At the centers of the external electrodes 3a and 3b in the longitudinal direction, support members 7 made from an electrically conductive material are provided. These support members 7 are bonded and connected to the pattern electrodes 6a to 6d via electrically conductive adhesive 8. This ladder filter 4 has a ladder circuit shown in FIG. 20. A metal cap (not shown) is placed on the substrate to cover the piezoelectric resonators 1a to 1d.

In the ladder filter 4 shown in FIGS. 16 to 20, since the external electrodes 3a and 3b are provided on one side surface of each of the piezoelectric resonators 1a to 1d, and the support members 7 made from the electrically conductive material are provided on the external electrodes 3a and 3b, the piezoelectric resonators 1a to 1d can be surface-mounted on the insulating substrate 5.

In the ladder filter 4 shown in FIGS. 16 to 20, different electrically conductive adhesives 8 disposed at adjacent areas may contact each other, electrically conductive adhesive 8 may contact a pattern electrode which is located nearby, or electrically conductive adhesive 8 may contact the support member of an adjacent adhesive 8 as shown in FIGS. 16 to 18. This leads to a short circuit between adjacent external electrodes 3a and 3b of the piezoelectric resonators 1a to 1d. This condition becomes prominent as the distances between the pattern electrodes 6a to 6d and the distances between the external electrodes 3a and 3b are narrowed to make the ladder filter compact.

SUMMARY OF THE INVENTION

In order to overcome the problems experienced by the prior art as described above, preferred embodiments of the present invention provide an electronic component, such as a ladder filter, having a surface-mountable piezoelectric resonator which is arranged and constructed such that external electrodes of the piezoelectric resonator are not short-circuited.

More specifically, preferred embodiments of the present invention provide an electronic component in which a piezoelectric resonator is disposed on a substrate having at least two mounting electrodes provided on a major surface of the substrate. The piezoelectric resonator includes a base member having a laminated body of a plurality of piezoelectric layers and a plurality of inner electrodes; two external electrodes provided on one side surface of the base member and electrically connected to the inner electrodes, the piezoelectric layers being polarized in the longitudinal direction of the base member, and the base member being adapted to be vibrated in a longitudinal vibration mode, wherein the two external electrodes of the piezoelectric resonator and the two mounting electrodes provided on the major surface of the substrate are connected and secured to each other respectively via electrically conductive bonding members and insulating bonding members disposed in the longitudinal direction of the base member between the external electrodes and the mounting electrodes respectively. The electrically conductive bonding members which connect and secure the two external electrodes are arranged so as not to be adjacent to each other in the width direction of the base member.

In the above-described electronic component, the piezoelectric resonator and the two mounting electrodes provided on the major surface of the substrate may be connected and secured via a support member made from an electrically conductive material.

The above electronic component may also comprise a plurality of the piezoelectric resonators and three or more of the mounting electrodes connected to the external electrodes of the plurality of piezoelectric resonators. A ladder filter may be produced with the above electronic component.

In an electronic component and a ladder filter according to a preferred embodiment of the present invention, the two external electrodes are provided on one side surface of the piezoelectric resonator, and the two external electrodes and the two mounting electrodes provided on the substrate are electrically and mechanically connected and secured via the electrically conductive bonding members and the insulating bonding members. Therefore, in the electronic component and the ladder filter according to preferred embodiments of the present invention, the piezoelectric resonator is surface-mounted on the substrate.

In an electronic component and a ladder filter according to preferred embodiments of the present invention, the electrically conductive bonding members which electrically connect the two external electrodes of the piezoelectric resonator and the two mounting electrodes provided on the substrate are disposed so as not to be adjacent to each other in the width direction of the base member. As a result, these electrically conductive bonding members do not touch each other. Since these electrically conductive bonding members are isolated by the insulating bonding members which secure the external electrodes and the mounting electrodes, these electrically conductive bonding members do not touch each other and are insulated from each other. Therefore, in the electronic component and the ladder filter according to preferred embodiments of the present invention, the external electrodes of the piezoelectric resonator are not short-circuited.

In an electronic component according to a preferred embodiment of the present invention, for example, the piezoelectric resonator and the two mounting electrodes provided on the substrate are connected and secured by the use of a support member made from an electrically conductive material.

In an electronic component and a ladder filter according to preferred embodiments of the present invention, since the piezoelectric resonator includes a base member formed by laminating a plurality of piezoelectric layers and a plurality of electrodes, two external electrodes electrically connected to the electrodes are provided on one side surface of the base member, and the piezoelectric layers are polarized in the longitudinal direction of the base member and an electric field is applied in the longitudinal direction of the base member to excite longitudinal vibration in the base member, the piezoelectric resonator is a stiffened type, in which the polarization direction, the direction of the electric field, and the vibration direction are the same. Therefore, as compared with an unstiffened piezoelectric resonator in which the vibration direction differs from the polarization direction and the electric-field direction, the stiffened piezoelectric resonator can have a larger electromechanical coupling coefficient and a larger selection range of the difference ΔF between the resonant frequency and the antiresonant frequency. In addition, with the use of the stiffened piezoelectric resonator, vibrations in a mode, such as a width mode or a thickness mode, which is different from the longitudinal vibration mode, do not occur and a spurious resonance is significantly reduced.

Other features and advantages of the present invention will become apparent from the following description of preferred embodiments of the present invention which re ers to the accompanying drawings.

DETAILED DESCRIPTION OF PREFERRED EMBODIMENTS

Figure 1:
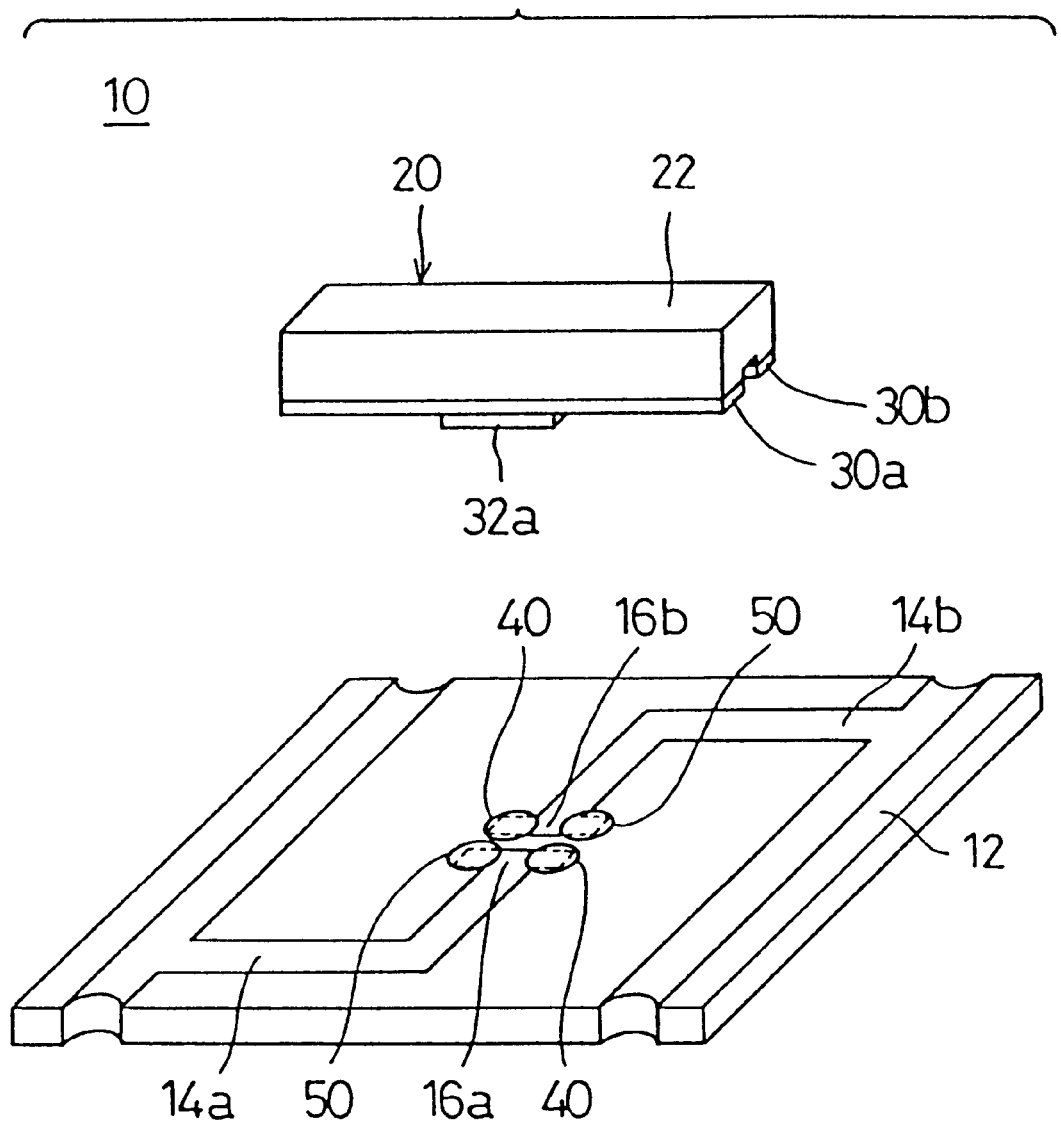
FIG. 1 is a perspective view of an electronic component, such as a discriminator, according to a preferred embodiment of the present invention.
Figure 2:
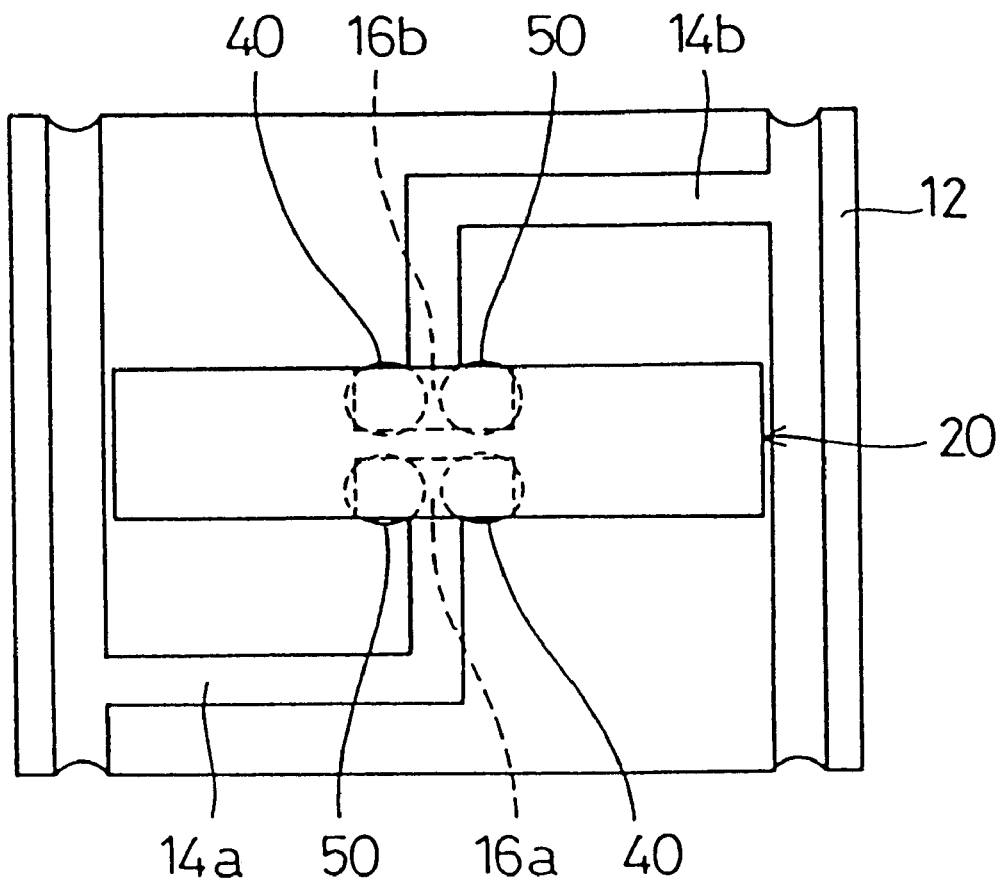
FIG. 2 is a plan view of the discriminator shown in FIG. 1.
Figure 3:
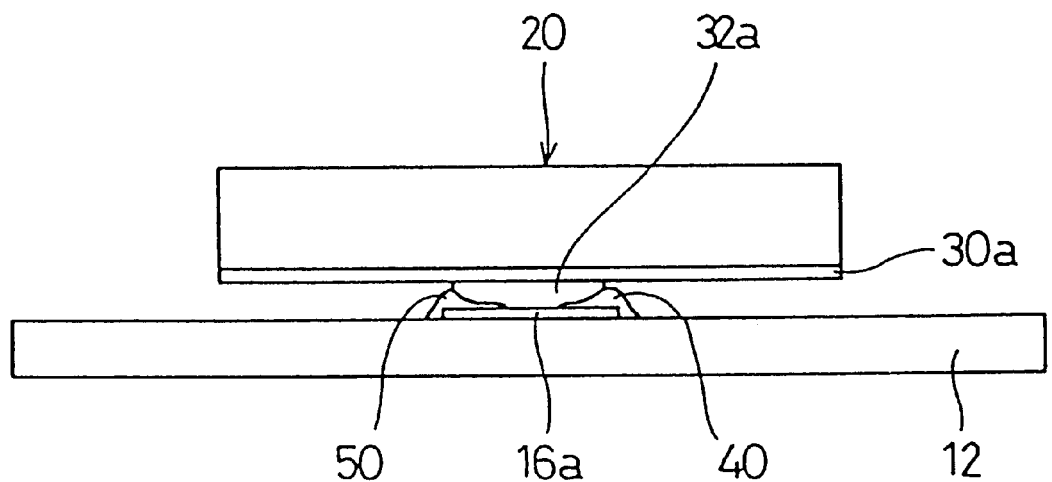
FIG. 3 is an elevation view of the discriminator shown in FIG. 1.
Figure 4:
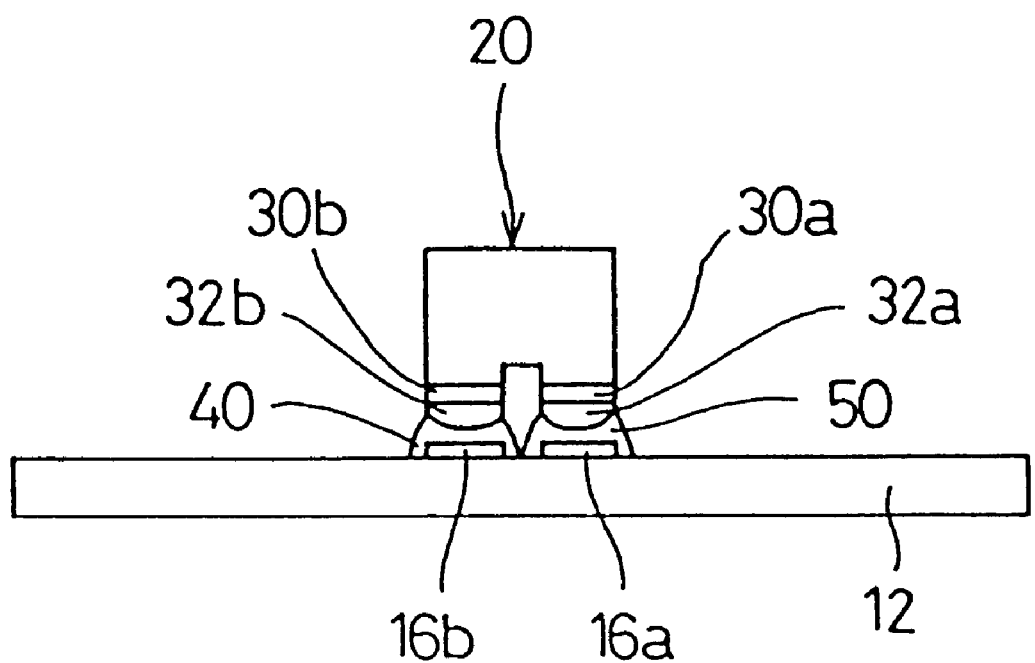
FIG. 4 is a side view of the discriminator shown in FIG. 1.
Figure 5:
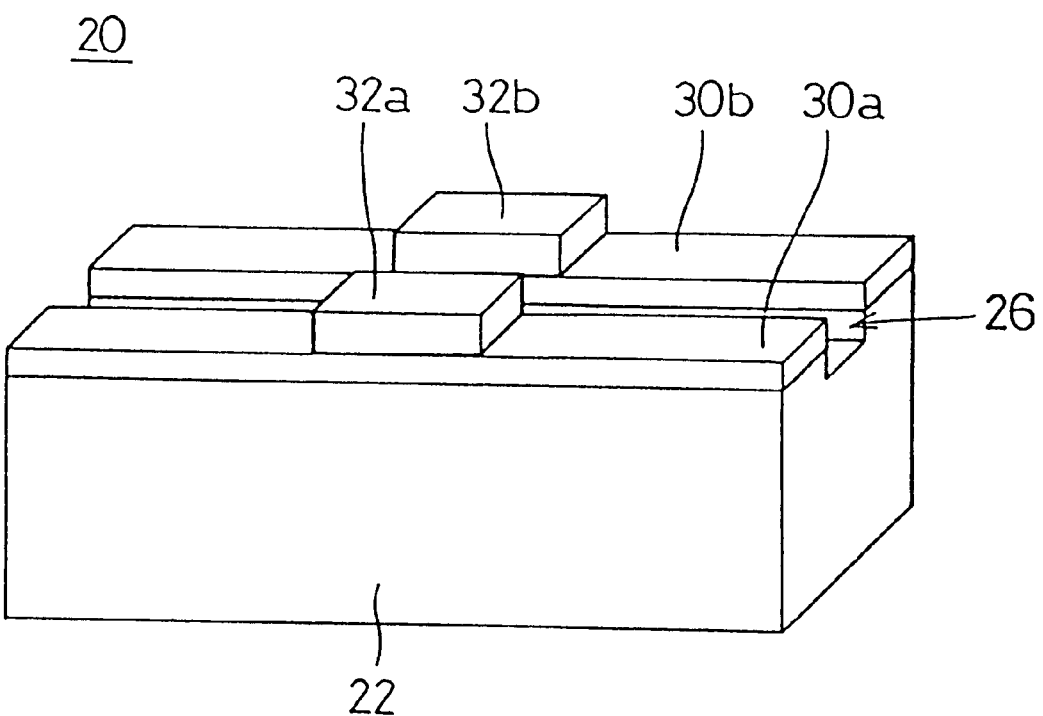
FIG. 5 is a perspective view of a piezoelectric resonator used for the discriminator shown in FIG. 1.
Figure 6:
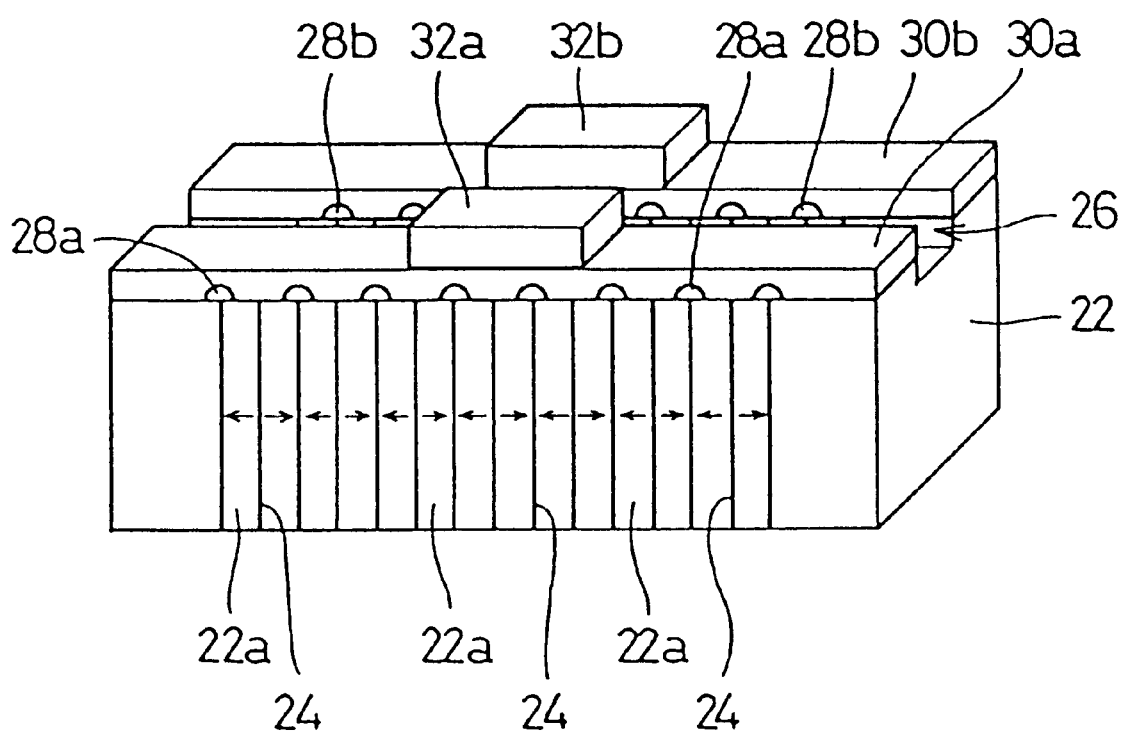
FIG. 6 is a view of the piezoelectric resonator shown in FIG. 5.
Figure 7:
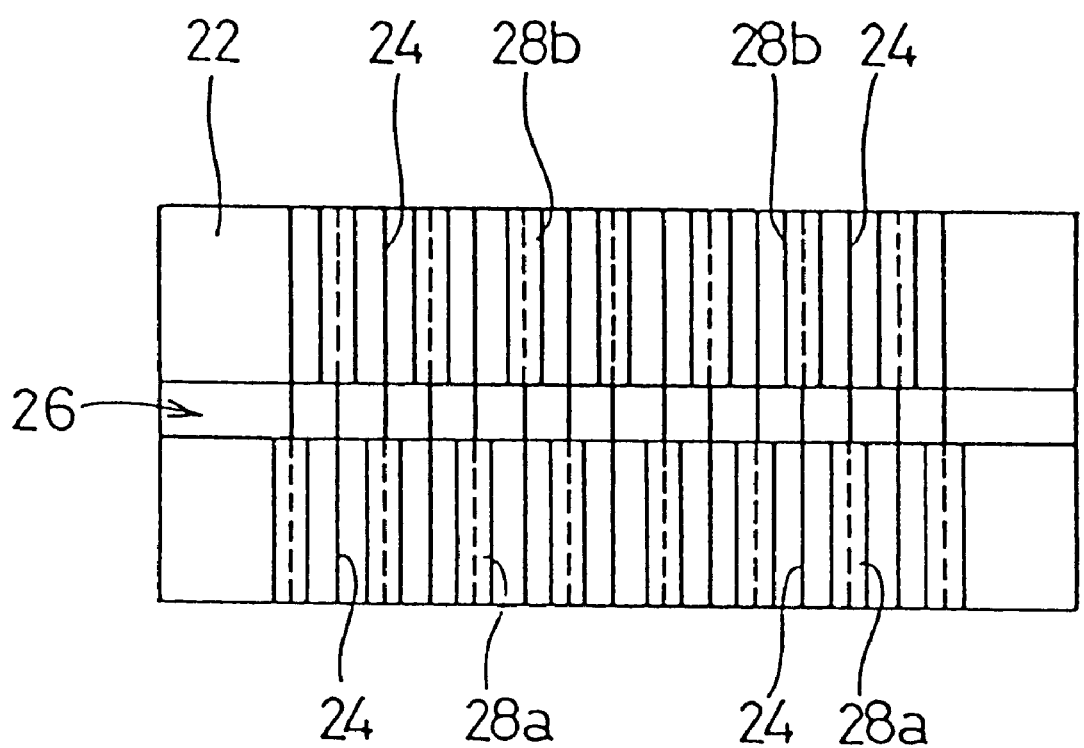
FIG. 7 is a plan view of a main section of the piezoelectric resonator shown in FIG. 5.

FIG. 1 is an exploded perspective view of an electronic component, such as a discriminator, according to a preferred embodiment of the present invention. FIG. 2 is a plan view of the discriminator. FIG. 3 is an elevation view of the discriminator, and FIG. 4 is a side view of the discriminator. FIG. 5 is a perspective view of a piezoelectric resonator used in the discriminator shown in FIG. 1. FIG. 6 is a view of the piezoelectric resonator, and FIG. 7 is a plan view of a main section of the piezoelectric resonator.

The discriminator 10 shown in FIG. 1 preferably includes, for example, a substantially rectangular-plate-shaped substrate 12. The substrate 12 is, for example, made from a resin substrate such as a glass-epoxy substrate, a ceramic substrate such as an alumina substrate, or a multilayer substrate.

On one major surface of the substrate 12, two pattern electrodes 14a and 14b which function as mounting electrodes are arranged to be spaced from each other by a distance. At opposing ends of these pattern electrodes 14a and 14b, lands 16a and 16b are provided. A piezoelectric resonator 20 is connected to the lands 16a and 16b of the pattern electrodes 14a and 14b.

The piezoelectric resonator 20 includes, for example, a substantially rectangular-parallelepiped base member 22. The base member 22 includes, for example, a plurality of laminated piezoelectric layers 22a (see FIG. 6) made from piezoelectric ceramic. On both major surfaces of a plurality of piezoelectric layers 22a, which are substantially perpendicular to the longitudinal direction of the base member 22, a plurality of internal electrodes 24 are provided at an intermediate portion of the base member 22 in the longitudinal direction. This means that the plurality of internal electrodes 24 are disposed substantially perpendicularly to the longitudinal direction of the base member 22 at certain intervals in the longitudinal direction of the base member 22. The plurality of piezoelectric layers 22a disposed at the intermediate portion of the base member 22 in the longitudinal direction are polarized in the longitudinal direction of the base member 22 as shown by arrows in FIG. 6 such that adjacent piezoelectric layers 22a are polarized in opposite directions. Piezoelectric layers 22a disposed at both ends of the base member 22 in the longitudinal direction are preferably not polarized.

On one side surface of the base member 22, a groove 26 extending in the longitudinal direction of the base member 22 is provided. The groove 26 is provided preferably at the approximate center in the width direction of the base member 22 and divides the side surface into two parts. As shown in FIG. 6, on the side surface divided by the groove 26, first insulating films 28a and second insulating films 28b are provided. At a first side of the side surface of the base member 22 divided by the groove 26, the first insulating films 28a cover the exposed portions of alternate internal electrodes 24. At a second side of the side surface of the base member 22 divided by the groove 26, the second insulating films 28b cover the exposed portions of the other alternate internal electrodes 24, which are not covered by the first insulating films 28a at the first side of the groove.

In the portions where the first and second insulating films 28a and 28b are provided on the base member 22, that is, on both sides of the groove 26, two external electrodes 30a and 30b are provided. Therefore, the external electrode 30a connects to internal electrodes 24 which are not covered by the first insulating films 28a, and the external electrode 30b connects to internal electrodes 24 which are not covered by the second insulating films 28b. In other words, adjacent internal electrodes 24 are connected to the external electrodes 30a and 30b, respectively.

At the approximate centers of the external electrodes 30a and 30b in the longitudinal direction, support members 32a and 32b are provided, respectively. These support members 32a and 32b are made from an electrically conductive material.

The piezoelectric resonator 20 uses the external electrodes 30a and 30b as input and output electrodes. Since the piezoelectric layers disposed at the intermediate section in the longitudinal direction of the base member 22 are polarized between adjacent internal electrodes 24 and an electric field is applied between the adjacent electrodes 24, the piezoelectric layers are piezoelectrically active. In this case, because voltages are applied in opposite directions to the piezoelectric layers 22a constituting the base member 22 which are polarized in opposite directions, the base member 22 as a whole, integral body expands and contracts in the same direction. Therefore, the entire piezoelectric resonator 20 vibrates in the longitudinal direction in a basic mode with the approximate center of the base member 22 in the longitudinal direction serving as a node. At both ends of the base member 22 in the longitudinal direction, piezoelectric layers are preferably not polarized and an electric field is not applied due to lack of electrodes. As a result, the layers at the ends of the base member 22 are piezoelectrically inactive.

In the piezoelectric resonator 20, the polarization direction of the base member 22, the applied electric field direction due to an input signal, and the direction of vibration in the base member 22 are all the same. In other words, the piezoelectric resonator 20 is a stiffened type resonator. The piezoelectric resonator 20 has a larger electromagnetic coupling coefficient than an unstiffened piezoelectric resonator, in which the direction of vibration differs from the direction of polarization and electric field. Therefore, the piezoelectric resonator 20 has a larger selection range of the frequency difference ΔF between the resonant frequency and the antiresonant frequency than an unstiffened piezoelectric resonator. This means that the piezoelectric resonator 20 achieves wide-frequency-band characteristics as compared with an unstiffened piezoelectric resonator.

In this piezoelectric resonator 20, the capacitance of the resonator can be adjusted by changing the opposing area of internal electrodes 24, the number of the piezoelectric layers 22a, or the electrodes 24, or the dimensions of the piezoelectric layers 22a in the longitudinal direction of the base member 22. In other words, the capacitance can be increased by increasing the opposing area of internal electrodes 24, by increasing the number of the piezoelectric layers 22a, or the electrodes 24, or by reducing the dimensions of the piezoelectric layers 22a in the longitudinal direction of the base member 22. In contrast, the capacitance can be decreased by reducing the opposing area of internal electrodes 24, by reducing the number of the piezoelectric layers 22a, or the electrodes 24, or by increasing the dimensions of the piezoelectric layers 22a in the longitudinal direction of the base member 22. Therefore, by adjusting the opposing area of internal electrodes 24 in the piezoelectric resonator 20, the number of the piezoelectric layers 22a, or the electrodes 24, or the dimensions of the piezoelectric layers 22a in the longitudinal direction of the base member 22, the capacitance is adjusted. As a result, a high degree of freedom for capacitance design is achieved. Therefore, it is easy to achieve impedance matching with an external circuit when the piezoelectric resonator 20 is mounted on a circuit board.

In this discriminator 10, on the land 16a of one pattern electrode 14a, a first end of one support member 32a in the longitudinal direction of the base member 22 is electrically connected via electrically conductive paste 40 and a second end of the support member 32a is mechanically and securely connected with an insulating member 50 made from an insulating material. On the land 16b of the other pattern electrode 14b, a first end of the other support member 32b, which is disposed adjacent to the first end of the support member 32a, in the longitudinal direction of the base member 22 is mechanically and securely connected with the insulating member 50 and the second end of the support member 32b, which is disposed adjacent to the second end of the support member 32a, is electrically connected with the electrically conductive paste 40. Urethane or silicone mixed with silver powder, for example, can be used to form the support members 32a and 32b.

In the above case, an electrically conductive material in which epoxy resin is mixed with silver powder is, for example, used for the electrically conductive paste 40, and an insulating material in which epoxy resin is mixed with silica is, for example, used for the insulating member 50. It is preferred that a material having a high thixotropy, which has a low viscosity and tendency to flow when stirred at application and which has a high viscosity and is unlikely to flow after the application, be used for the insulating member 50.

In the above case, it is preferred that the insulating material for the insulating members 50 is applied first and then the electrically conductive material for the electrically conductive paste 40 is applied to the lands 16a and 16b of the pattern electrodes 14a and 14b, so that one support member 32a and the land 16a of the pattern electrode 14a are insulated from the electrically conductive paste 40 which electrically connects the other support member 32b to the land 16b of the pattern electrode 14b, with the insulating member 50, and so that the other support member 32b and the land 16b of the pattern electrode 14b are insulated from the electrically conductive paste 40 which electrically connects one support member 32a to the land 16a of the pattern electrode 14a, with the insulating member 50.

In addition, in the above case, it is preferred that the electrically conductive paste 40 and the insulating member 50 be arranged so as not to touch the piezoelectric resonator 20, in order to avoid any damping or hindrance of vibration of the piezoelectric resonator 20.

A metal cap (not shown) is mounted on the substrate 12 so as to cover the piezoelectric resonator 20. To prevent the metal cap from being short-circuited to the pattern electrodes 14a and 14b, insulating resin is preferably applied to the substrate 12 and the pattern electrodes 14a and 14b.

The two external electrodes 30a and 30b are provided on one side surface of the piezoelectric resonator 20, the two support members 32a and 32b made from the electrically conductive material are provided on the two external electrodes 30a and 30b, and the two support members 32a and 32b are electrically and mechanically connected and secured to the two pattern electrodes 14a and 14b on the substrate 12 via the electrically conductive paste 40 and the insulating member 50. Therefore, the piezoelectric resonator 20 is surface-mounted on the substrate 12.

Since the electrically conductive paste 40 which electrically connects one support member 32a to one pattern electrode 14a is not adjacent to the electrically conductive paste 40 which electrically connects the other support member 32b to the other pattern electrode 14b, the two electrically conductive pastes 40 do not touch each other. Furthermore, one support member 32a and one pattern electrode 14a are insulated, with the use of the insulating member 50 which mechanically connects the support member 32a and the electrode 14a, from the electrically conductive paste 40 which electrically connects the other support member 32b to the other pattern electrode 14b. The other support member 32b and the other pattern electrode 14b are insulated, with the use of the insulating member 50 which mechanically connects the support member 32b and the pattern electrode 14b, from the electrically conductive paste 40 which electrically connects the support member 32a to the pattern electrode 14a. Therefore, the two external electrodes 30a and 30b of the piezoelectric resonator 20 are not short-circuited in this discriminator 10.

As described above, this discriminator 10 includes the piezoelectric resonator 20 which has a small spurious resonance and a large selection range of the difference ΔF between the resonant frequency and the antiresonant frequency.

Since the piezoelectric resonator 20 is supported in a raised arrangement on the substrate 12 by the support members 32a and 32b, provided near the node of the piezoelectric resonator 20, the vibration of the piezoelectric resonator 20 is not damped.

Since the support members 32a and 32b are provided near the node of the piezoelectric resonator 20 in this discriminator 10, the piezoelectric resonator 20 can be easily and reliably supported in a condition in which the vibration of the piezoelectric resonator 20 is not damped because the support members 32a and 32b are located at the node point of the resonator 20.

Figure 8:
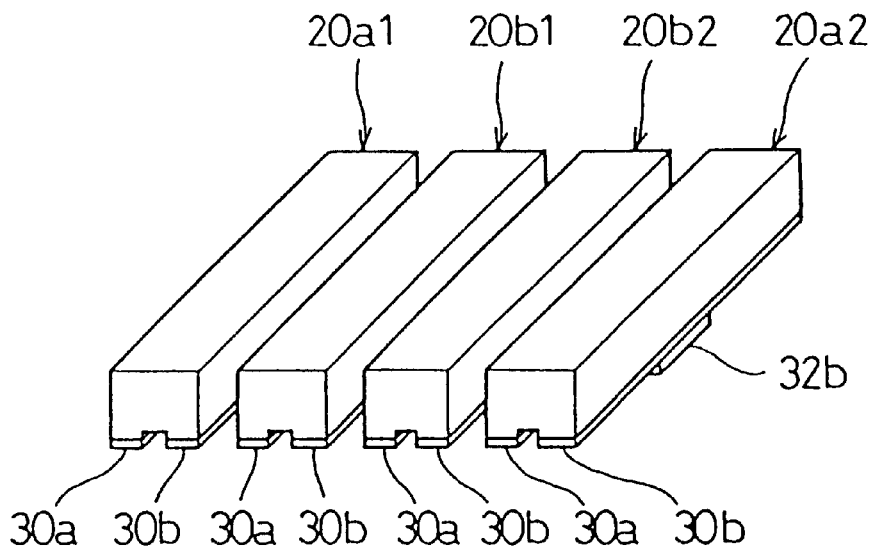
FIG. 8 is an exploded perspective view of a ladder filter according to a preferred embodiment of the present invention.
Figure 8:
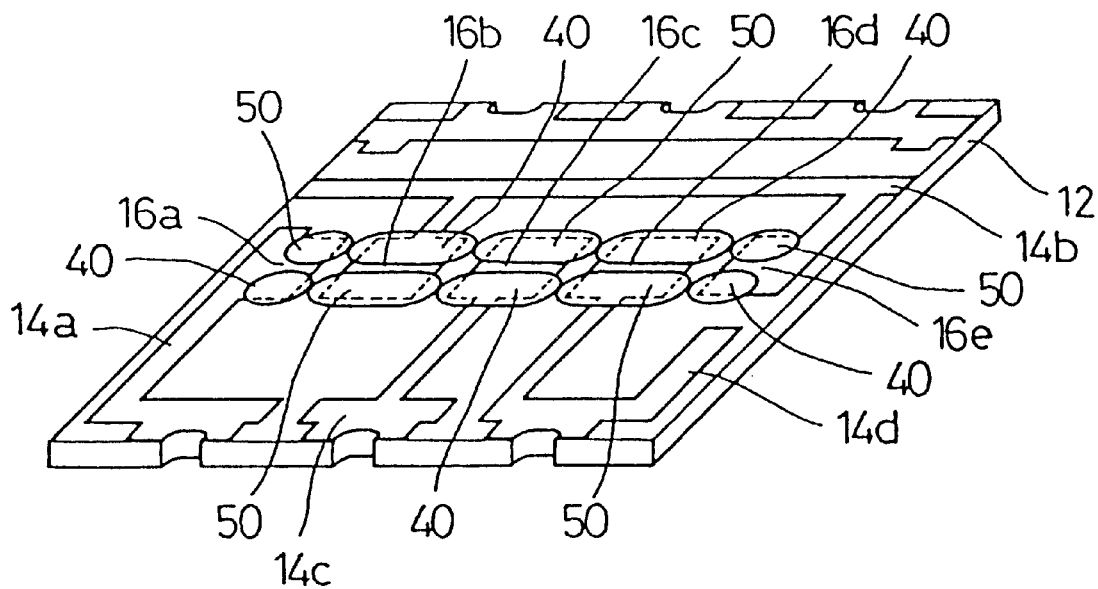
Figure 9:
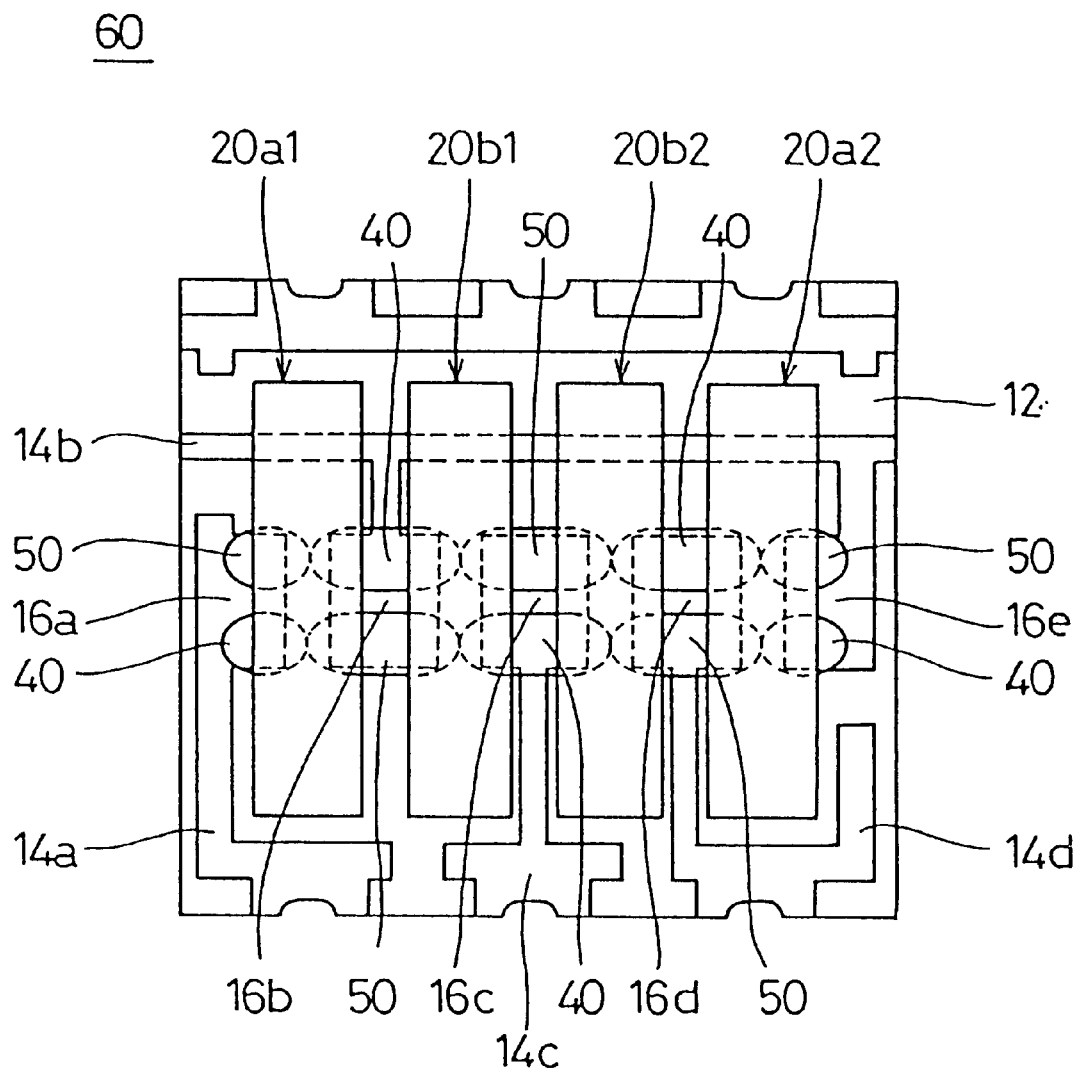
FIG. 9 is a plan view of the ladder filter shown in FIG. 8.
Figure 10:
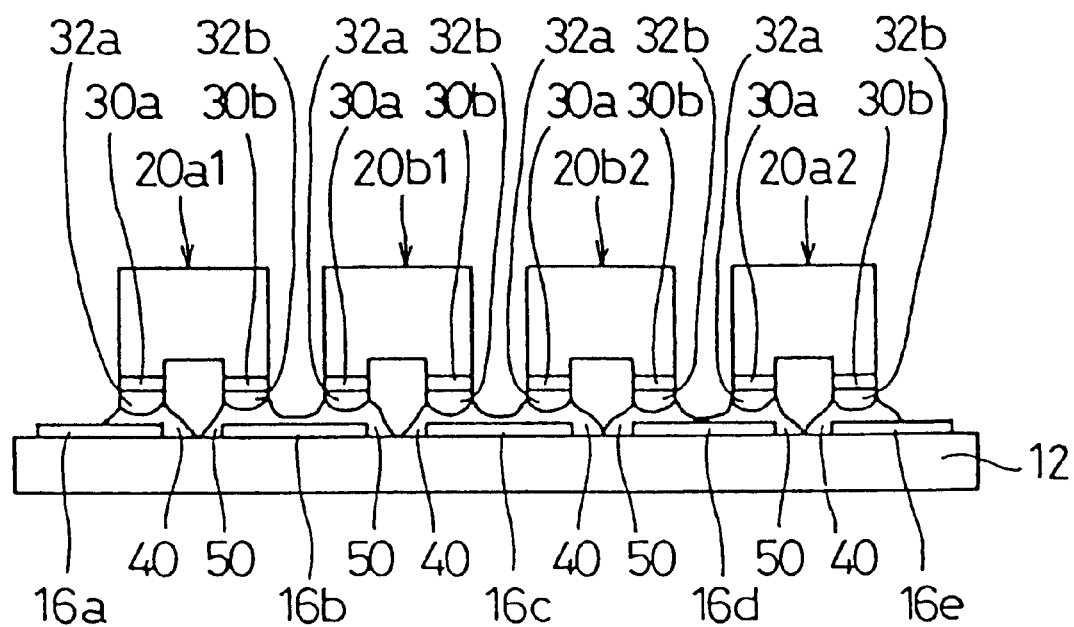
FIG. 10 is an elevation view of the ladder filter shown in FIG. 8.
Figure 11:
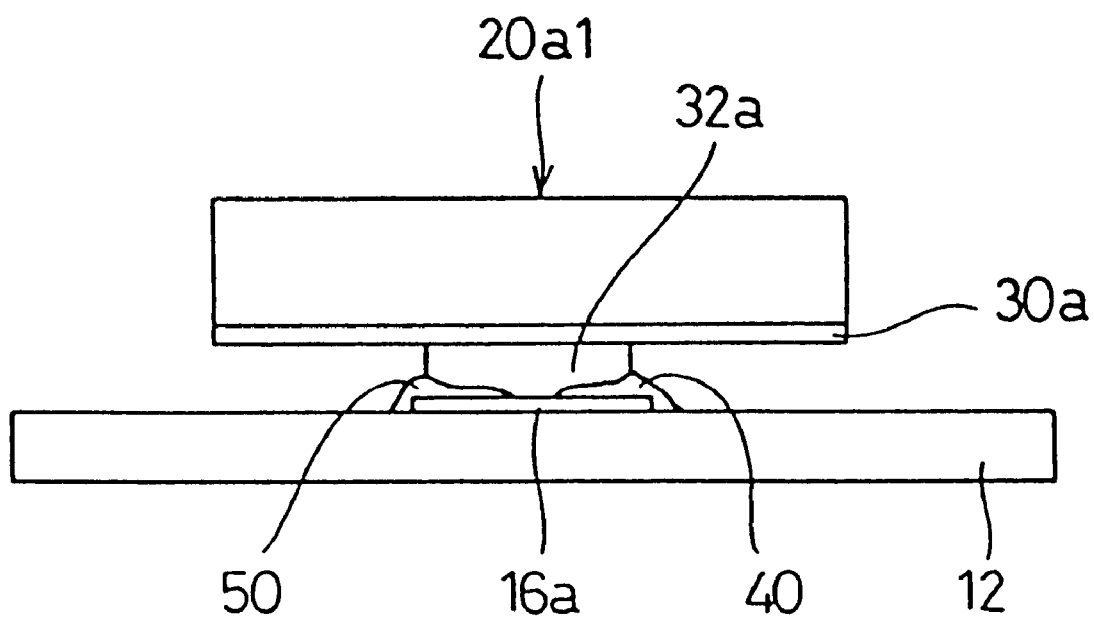
FIG. 11 is a side view of the ladder filter shown in FIG. 8.
Figure 12:
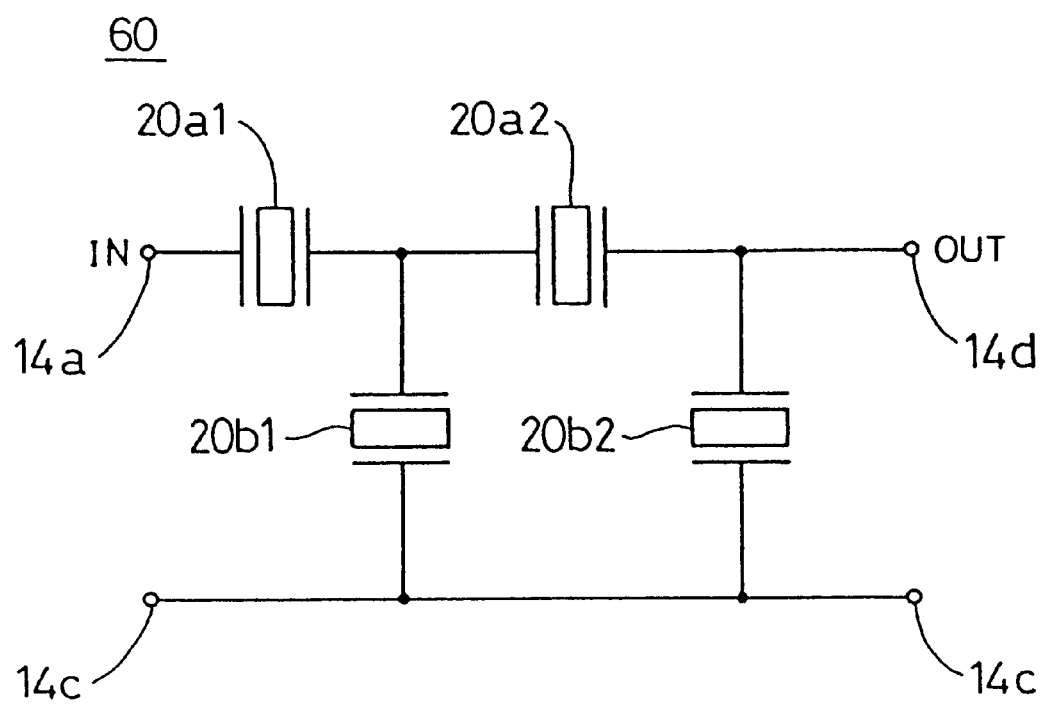
FIG. 12 is a circuit diagram of the ladder filter shown in FIG. 8.

FIG. 8 is an exploded perspective view of a ladder filter according to preferred embodiments of the present invention. FIG. 9 is a plan view of the ladder filter, and FIG. 10 is an elevation view of the ladder filter. FIG. 11 is a side view of the ladder filter, and FIG. 12 is a circuit diagram of the ladder filter.

The ladder filter 60 shown in FIG. 8 includes, for example, a substantially rectangular-plate-shaped substrate 12.

On one major surface of the substrate 12, four pattern electrodes 14a, 14b, 14c and 14d are arranged to be separated via gaps. Five lands 16a, 16b, 16c, 16d and 16e are provided in line with gaps on the pattern electrodes 14a to 14d. In this case, the lands 16a to 16d are provided at ends of the pattern electrodes 14a to 14d, and the land 16e is provided at the other end of the pattern electrode 14b.

On the lands 16a to 16e of the pattern electrodes 14a to 14d, four piezoelectric resonators 20a1, 20b1, 20b2, and 20a2 are disposed in line in this order. The piezoelectric resonators 20a1, 20b1, 20b2 and 20a2 preferably have the same structure as the piezoelectric resonator 20 described above. Two piezoelectric resonators 20a1 and 20a2 are adapted to function as series resonators, and the other two piezoelectric resonators 20b1 and 20b2 function as parallel resonator. Therefore, the piezoelectric resonators 20b1 and 20b2, functioning as parallel resonators, are designed to have larger capacitances than the piezoelectric resonators 20a1 and 20a2, functioning as series resonators.

On the land 16a of the pattern electrode 14a, one end of the support member 32a of the piezoelectric resonator 20a1 in the longitudinal direction of the piezoelectric resonator 20a1 is electrically connected via electrically conductive paste 40, and the other end of the support member 32a is mechanically firmly connected via an insulating member 50.

On the land 16b of the pattern electrode 14b, one end of the support member 32b of the piezoelectric resonator 20a1 in the longitudinal direction of the piezoelectric resonator 20a1 and one end of the support member 32a of the piezoelectric resonator 20b1 in the longitudinal direction of the piezoelectric resonator 20b1 are mechanically firmly connected via the insulating member 50, and the other end of the support member 32b of the piezoelectric resonator 20a1 and the other end of the support member 32a of the piezoelectric resonator 20b1 are electrically connected via the electrically conductive paste 40.

On the land 16c of the pattern electrode 14c, one end of the support member 32b of the piezoelectric resonator 20b1 in the longitudinal direction of the piezoelectric resonator 20b1 and one end of the support member 32a of the piezoelectric resonator 20b2 in the longitudinal direction of the piezoelectric resonator 20b2 are electrically connected via the electrically conductive paste 40, and the other end of the support member 32b of the piezoelectric resonator 20b1 and the other end of the support member 32a of the piezoelectric resonator 20b2 are mechanically firmly connected via the insulating member 50.

On the land 16d of the pattern electrode 14d, one end of the support member 32b of the piezoelectric resonator 20b2 in the longitudinal direction of the piezoelectric resonator 20b2 and one end of the support member 32a of the piezoelectric resonator 20a2 in the longitudinal direction of the piezoelectric resonator 20a2 are mechanically firmly connected via the insulating member 50, and the other end of the support member 32b of the piezoelectric resonator 20b2 and the other end of the support member 32a of the piezoelectric resonator 20a2 are electrically connected via the electrically conductive paste 40.

On the land 16e of the pattern electrode 14b, one end of the support member 32b of the piezoelectric resonator 20a2 in the longitudinal direction of the piezoelectric resonator 20a2 is electrically connected via the electrically conductive paste 40, and the other end of the support member 32b is mechanically firmly connected via the insulating member 50.

Therefore, the ladder filter 60 has a ladder circuit shown in FIG. 12. In other words, in this ladder filter 60, the pattern electrode 14a is an input terminal, the pattern electrode 14d is an output terminal, and the pattern electrode 14c is a ground terminal.

In this ladder filter 60, a metal cap (not shown) is mounted on the substrate 12 so as to cover the piezoelectric resonators 20a1, 20b1, 20b2 and 20a2. In this case, insulating resin is preferably applied to the substrate 12 and the pattern electrodes 14a to 14d such that the metal cap is not electrically connected to the pattern electrodes 14a to 14d.

Like the discriminator 10 described above, the piezoelectric resonators 20a1, 20b1, 20b2, and 20a2 can be surface-mounted on the substrate 12 also in this ladder filter 60.

Like the discriminator 10 described above, the external electrodes 30a and 30b of the piezoelectric resonators 20a1, 20b1, 20b2 and 20a2 cannot be short-circuited also in this ladder filter 60.

Like the discriminator 10 described above, this ladder filter 60 includes piezoelectric resonators 20a1, 20b1, 20b2 and 20a2 each of which has a small spurious resonance and a large selection range in the difference ΔF between the resonant frequency and the antiresonant frequency.

Since two external electrodes of adjacent piezoelectric resonators are disposed on the same pattern electrode and electrically and mechanically connected and secured in this ladder filter 60, insulation between those external electrodes is not required, and adjacent piezoelectric resonators can be located very close to each other, allowing the filter to be made much more compact than previously possible.

Since two external electrodes of adjacent piezoelectric resonators are disposed on the same pattern electrode and electrically and mechanically connected and secured in this ladder filter 60, simple pattern electrodes can be used and complicated pattern electrodes are not needed. As a result, the filter is made to be significantly compact.

Since the piezoelectric resonators 20a1, 20b1, 20b2 and 20a2 are supported in a raised arrangement on the substrate 12 by the support members 32a and 32b provided at the nodes of the resonators in this ladder filter 60, the vibrations of the piezoelectric resonators 20a1, 20b1, 20b2, and 20a2 are not damped.

Since the support members 32a and 32b are provided at the nodes of the piezoelectric resonators 20a1, 20b1, 20b2 and 20a2 in this ladder filter 60, the piezoelectric resonators 20a1, 20b1, 20b2 and 20a2 can be easily supported in a condition in which the vibrations thereof are not damped, just by securing the support members 32a and 32b.

Attenuation in the ladder filter is determined by the capacitance ratio between the series resonators and the parallel resonators. In this ladder filter 60, the capacitances can be adjusted by changing the opposing area of internal electrodes 24 in the piezoelectric resonators 20a1, 20b1, 20b2, and 20a2, the number of the piezoelectric layers 22a, or the internal electrodes 24, or the dimensions of the piezoelectric layers 22a in the longitudinal direction of the base member 22. Therefore, a ladder filter having a larger attenuation with fewer resonators is implemented by changing the capacitances of the piezoelectric resonators 20a1, 20b1, 20b2, and 20a2, as compared with a case where unstiffened piezoelectric resonators are used. Since the selection range of the difference ΔF in the piezoelectric resonators 20a1, 20b1, 20b2 and 20a2 can be made larger than the conventional piezoelectric resonator, a wider transmission frequency band is achieved as compared with the conventional piezoelectric resonator.

In the discriminator 10 and the ladder filter 60 described above, the grooves 26 are provided at one side surface of the base members 22 in the piezoelectric resonators 20, 20a1, 20a2, 20b1 and 20b2. Such a groove 26 is not necessarily required.

Other electronic components, such as an oscillator, having the same structure as the discriminator 10 described above can be obtained.

In the discriminator 10 described above, the support members 32a and 32b are not necessarily required. The base member 22 of the piezoelectric resonator 20 may be connected and secured to the lands 16a and 16b of the pattern electrodes 14a and 14b on the substrate 12 via the insulating member 50 and the electrically conductive paste 40. In this case, it is preferred that soft materials such as urethane and silicone be used for the insulating member 50 and the electrically conductive paste 40 in order that the vibration of the piezoelectric resonator is not damped. For example, an electrically conductive material in which urethane or silicone is mixed with silver powder is used for the electrically conductive paste 40, and an insulating material in which urethane or silicone is mixed with silica is used for the insulating member 50. This condition is also applied to the ladder filter 60 described above.

In the ladder filter 60 described above, the metal cap is not necessarily insulated from all the pattern electrodes 14a to 14d on the substrate 12. The metal cap may be disposed so as to electrically connect only to the pattern electrode 14c, which is connected to the ground. With such a structure, a shielding effect with the use of the metal cap is obtained.

Figure 13:
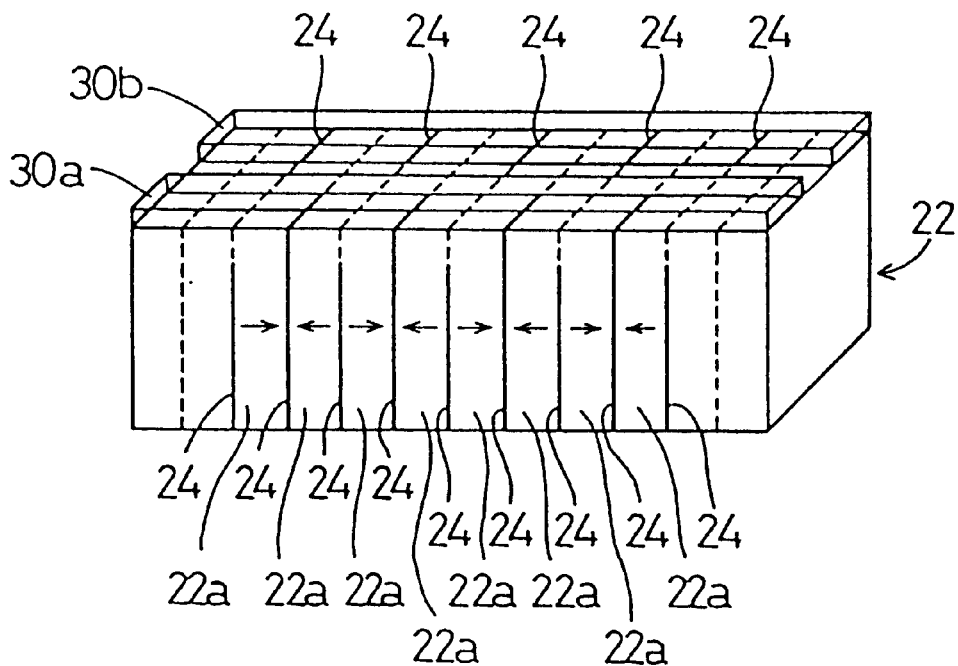
FIG. 13 is a view of another piezoelectric resonator according to preferred embodiments of the present invention.
Figure 14A:
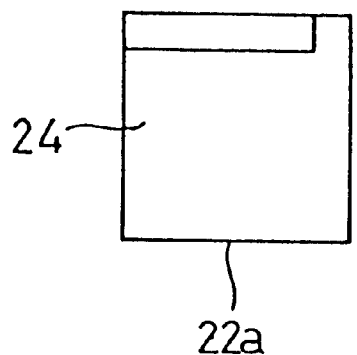
FIGS. 14(*a*) and 14(*b*) are plan views showing electrodes used for the piezoelectric resonator shown in FIG. 13.
Figure 14B:
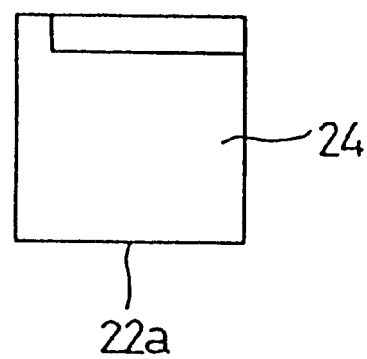
Figure 15:
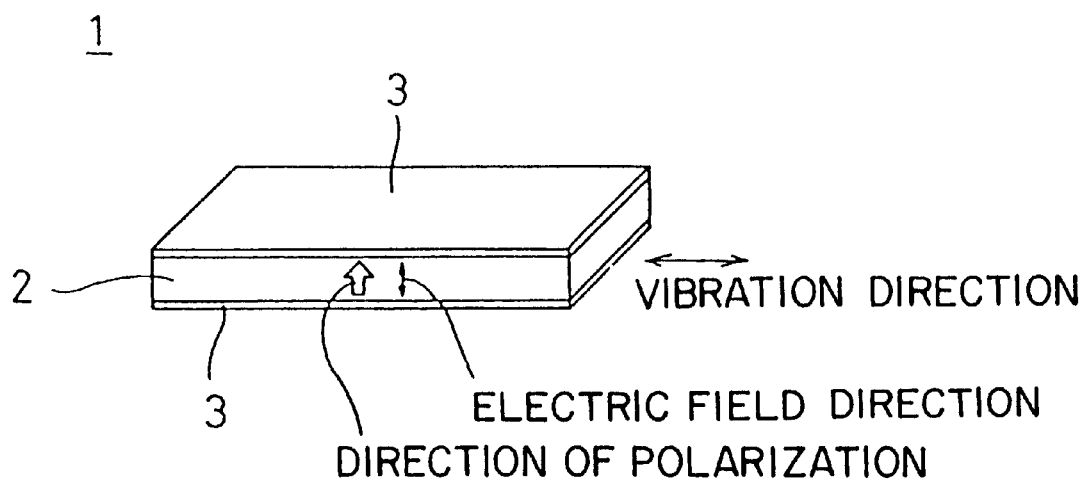
FIG. 15 is a perspective view of a conventional piezoelectric resonator which provides a background of the present invention.
Figure 16:
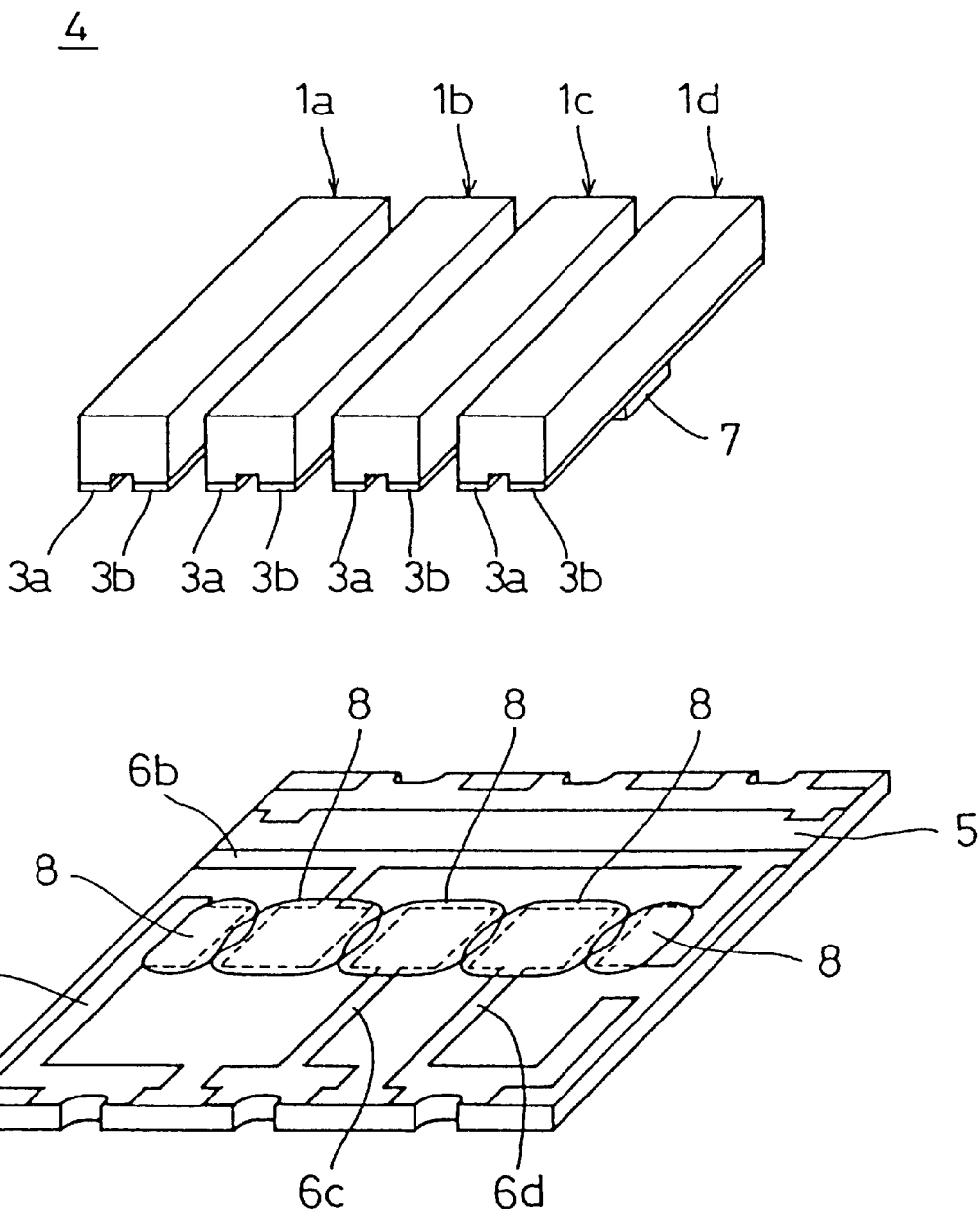
FIG. 16 is an exploded perspective view of a ladder filter which provides a background of the present invention.
Figure 17:
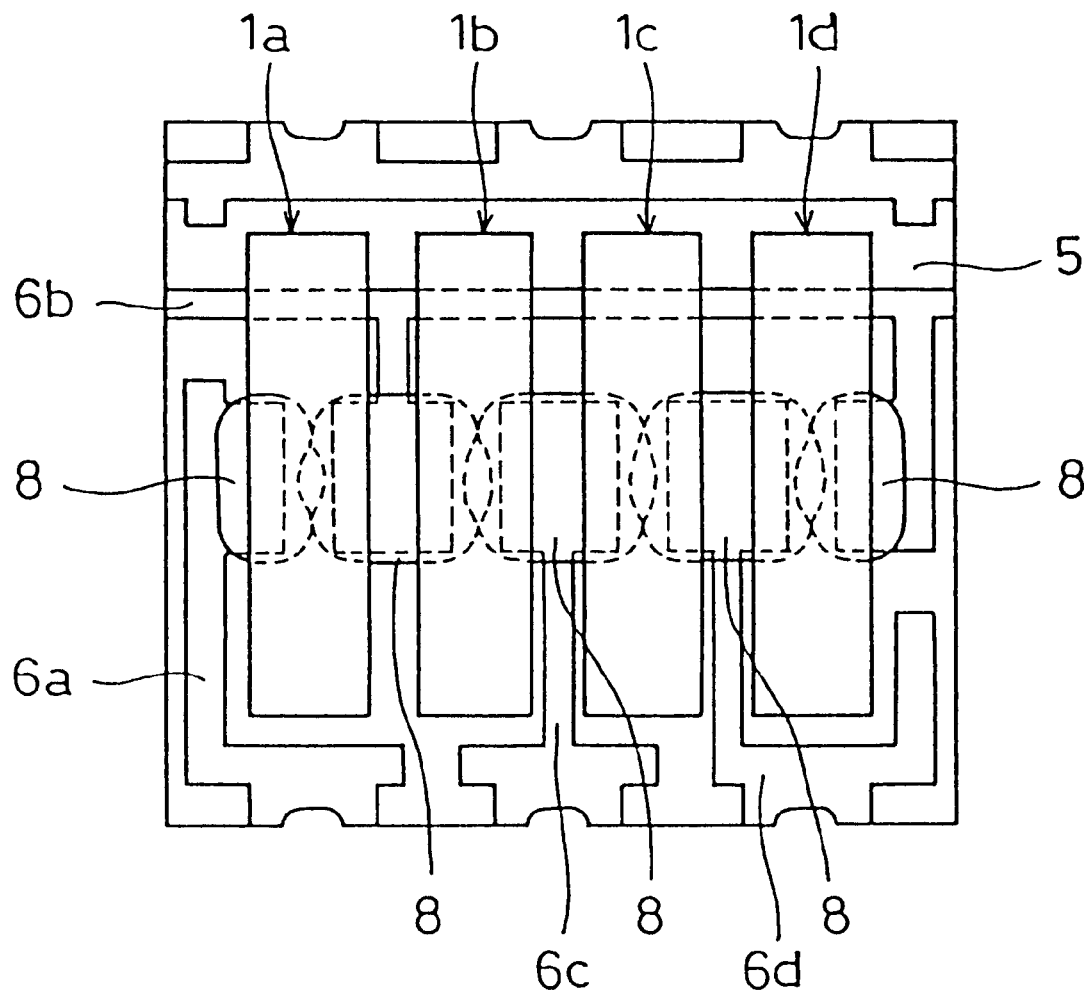
FIG. 17 is a plan view of the ladder filter shown in FIG. 16.
Figure 18:
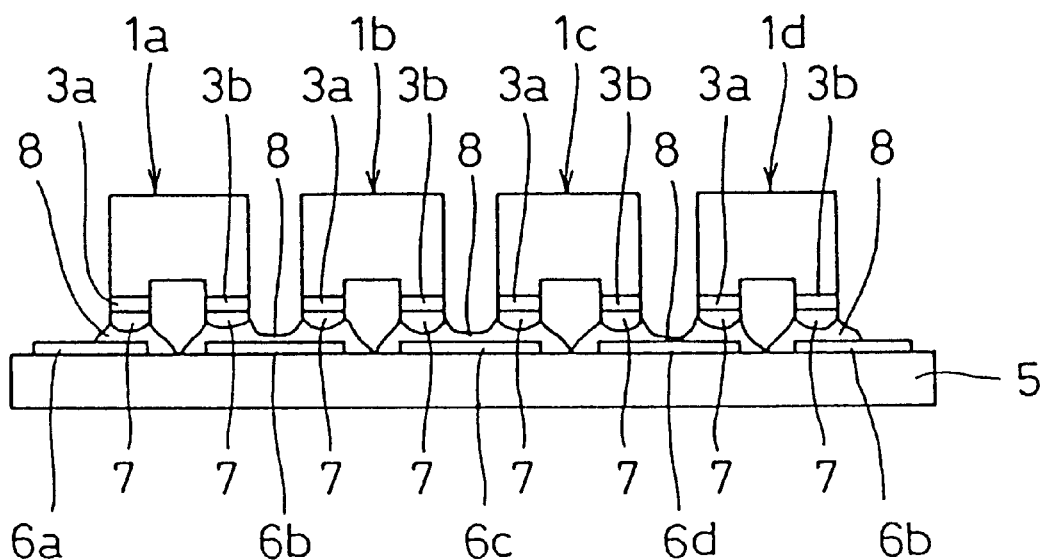
FIG. 18 is an elevation view of the ladder filter shown in FIG. 16.
Figure 19:
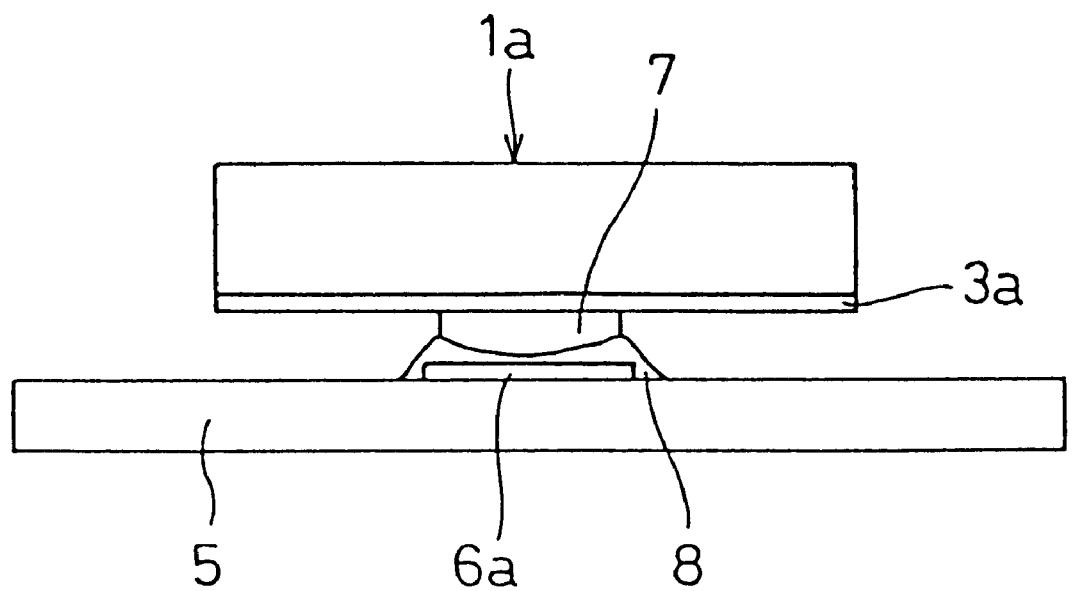
FIG. 19 is a side view of the ladder filter shown in FIG. 16.
Figure 20:
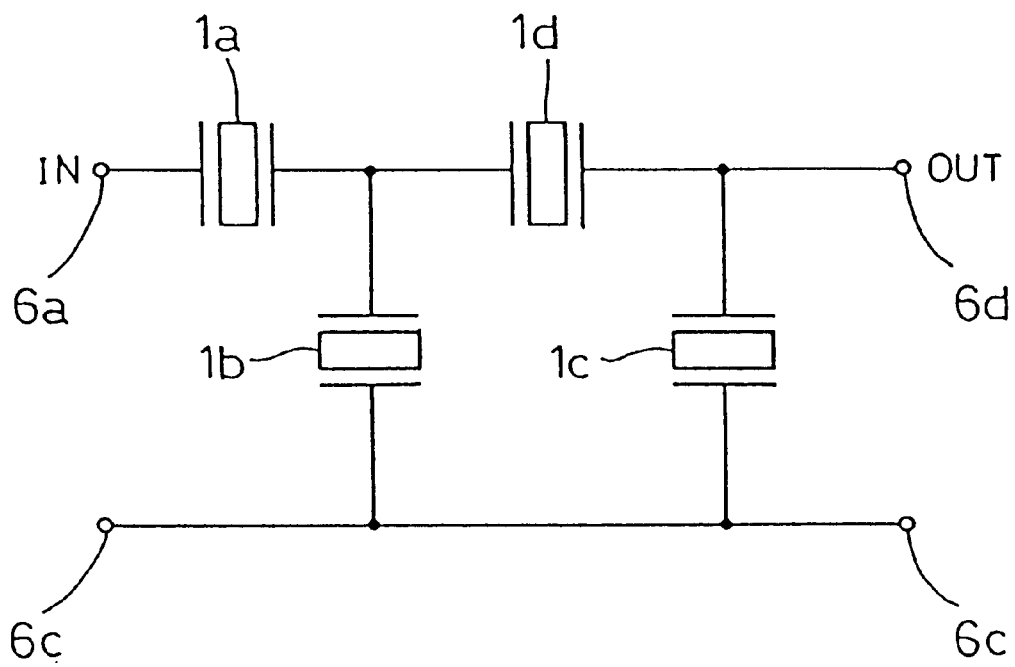
FIG. 20 is a circuit diagram of the ladder filter shown in FIG. 16.

FIG. 13 is a view of another piezoelectric resonator. FIG. 14 is a plan view of electrodes used for the piezoelectric resonator. Unlike the piezoelectric resonator shown in FIGS. 5 to 7, alternate internal electrodes 24 are provided on major surfaces of the piezoelectric layers 22a except for one end at an upper section as shown in FIG. 14(*a*) in the piezoelectric resonator shown in FIG. 13, and the other alternate internal electrodes 24 are provided on major surfaces of the piezoelectric layers 22a except for the other end of the upper section as shown in FIG. 14(*b*). Since the internal electrodes 24 are arranged in this way, one end of an edge of each of the alternate internal electrodes 24 or the other end of the edge of each of the other alternate internal electrodes 24 is not exposed on one side surface of the base member 22. Therefore, unlike the piezoelectric resonator shown in FIGS. 5 to 7, the insulating films 28a and 28b are not provided in the piezoelectric resonator shown in FIG. 13. In the present invention, the piezoelectric resonator shown in FIG. 13 may be used.

In each of the above piezoelectric resonators 20, both ends of the base member 22 in the longitudinal direction are piezoelectrically inactive. Such a portion which is piezoelectrically inactive may be provided at a part of the base member 22 other than both ends thereof in the longitudinal direction. Alternatively, the entire base member 22 in the longitudinal direction may be formed to be piezoelectrically active.

In an electronic component and a ladder filter according to preferred embodiments of the present invention, the number of piezoelectric resonators and the number of pattern electrodes may be changed as desired.

While the invention has been particularly shown and described with reference to preferred embodiments thereof, it will be understood by those skilled in the art that the forgoing and other changes in form and details may be made therein without departing from the spirit of the invention.

What is claimed is:

1. An electronic component comprising:
    a substrate including at least two mounting electrodes disposed on a major surface thereof;
    at least one piezoelectric resonator disposed on said substrate, said at least one piezoelectric resonator including:
        a base member having a laminated body of a plurality of piezoelectric layers and a plurality of inner electrodes, said piezoelectric layers being polarized in the longitudinal direction of said base member and said base member being adapted to be vibrated in a longitudinal vibration mode;
        at least two external electrodes provided on one side surface of said base member and electrically connected to said inner electrodes; and
    electrically conductive bonding members and insulating bonding members;
    first and second support members made from an electrically conductive material and provided on the at least two external electrodes provided on the one side surface of a piezoelectric resonator; wherein
    the at least two external electrodes of said piezoelectric resonator and the at least two mounting electrodes provided on the major surface of said substrate are connected and secured to each other respectively via said electrically conductive bonding members and said insulating bonding members disposed between the external electrodes and the at least two mounting electrodes;
    the electrically conductive bonding members are disposed so as to not be adjacent to each other in a width direction of said base member;
    one end of the first support member is electrically connected to a land of a first of the at least two mounting electrodes via a first of said electrically conductive bonding members and the other end of the first support member is mechanically connected to a first of said insulating bonding members disposed on the substrate, and one end of the second support member is electrically connected to a land of a second of the at least two mounting electrodes via a second of said electrically conductive bonding members and the other end of the second support member is mechanically connected to a second of said insulating bonding members disposed on the substrate.

2. The electronic component according to claim 1, further comprising a support member made from an electrically conductive material, wherein said piezoelectric resonator and the at least two mounting electrodes provided on the major surface of said substrate are connected and secured via said support member.

3. The electronic component according to claim 1, further comprising a plurality of said piezoelectric resonators and at least three of said at least two mounting electrodes connected to the external electrodes of the plurality of piezoelectric resonators.

4. The electronic component according to claim 1, wherein the electronic component is a discriminator.

5. The electronic component according to claim 1, wherein adjacent ones of the piezoelectric layers are polarized in opposite directions.

6. The electronic component according to claim 1, further comprising a groove formed in the one side surface of the base member and in between the at least two external electrodes.

7. The electronic component according to claim 1, further comprising first insulating films and second insulating films provided on the one side surface of the base member.

8. The electronic component according to claim 1, further comprising support members disposed at approximate centers of the at least two external electrodes.

9. The electronic component according to claim 1, wherein a direction of polarization of the base member, a direction of an electric field applied via an input signal, and a direction of vibration of the base member are the same.

10. The electronic component according to claim 1, wherein the electrically conductive bonding members are separated from each other by the insulating bonding members.

11. A ladder filter comprising:
    a substrate including a plurality of mounting electrodes disposed on a major surface thereof;
    a plurality of piezoelectric resonators disposed on said substrate, at least one of said plurality of piezoelectric resonators including:

a base member having a laminated body of a plurality of piezoelectric layers and a plurality of inner electrodes, said piezoelectric layers being polarized in the longitudinal direction of said base member and said base member being adapted to be vibrated in a longitudinal vibration mode, at least two external electrodes provided on one side surface of said base member and electrically connected to said inner electrodes;

electrically conductive bonding members and insulating bonding members;

first and second support members made from an electrically conductive material and provided on the at least two external electrodes provided on the one side surface of said at least one piezoelectric resonator, wherein one end of the first support member is electrically connected to a land of a first of at least two associated mounting electrodes via a first of the electrically conductive bonding members and the other end of the first support member is mechanically connected to a first of said insulating bonding members disposed on the substrate, and one end of the second support member is electrically connected to a land of a second of the at least two associated mounting electrodes via a second of said electrically conductive bonding members and the other end of the second support member is mechanically connected to a second of said insulating bonding members; wherein the at least two external electrodes of said at least one piezoelectric resonator and the at least two associated mounting electrodes provided on the major surface of said substrate are connected and secured to each other respectively via said electrically conductive bonding members and said insulating bonding members disposed between the external electrodes and the at least two mounting electrodes; and the electrically conductive bonding members which connect and secure the at least two external electrodes are disposed so as not to be adjacent to each other in a width direction of said base member.

12. The electronic component according to claim 11, wherein the electrically conductive bonding members are separated from each other by the insulating bonding members.

13. An electronic component comprising:

a substrate including at least two mounting electrodes disposed on a major surface thereof;

at least one piezoelectric resonator disposed on said substrate, said at least one piezoelectric resonator including:

a base member having a laminated body of a plurality of piezoelectric layers and a plurality of inner electrodes, at least two external electrodes provided on one side surface of said base member and electrically connected to said inner electrodes, the piezoelectric layers being polarized in the longitudinal direction of said base member, and the base member being adapted to be vibrated in a longitudinal vibration mode;

first and second support members made from an electrically conductive material and provided on the at least two external electrodes provided on the one side surface of a piezoelectric resonator; wherein the at least two external electrodes of said piezoelectric resonator and the at least two mounting electrodes provided on the major surface of said substrate are connected and secured to each other respectively via electrically conductive bonding members and insulating bonding members disposed between the external electrodes and the at least two mounting electrodes respectively, the electrically conductive bonding members being separated from each other by the insulating bonding members;

one end of the first support member is electrically connected to a land of a first of the at least two mounting electrodes via a first of the electrically conductive bonding members and the other end of the first support member is mechanically connected to a first of said insulating bonding members disposed on the substrate, and one end of the second support member is electrically connected to a land of a second of the at least two mounting electrodes via a second of said electrically conductive bonding members and the other end of the second support member is mechanically connected to a second of said insulating bonding members.

14. The electronic component according to claim 13, further comprising a plurality of said piezoelectric resonators and at least three of said at least two mounting electrodes connected to the external electrodes of the plurality of piezoelectric resonators.

15. The electronic component according to claim 13, wherein the electrically conductive bonding members which connect and secure the at least two external electrodes are disposed so as not to be adjacent to each other in a width direction of said base member.

* * * * *